United States Patent
Hidvegi et al.

(10) Patent No.: US 7,447,620 B2
(45) Date of Patent: Nov. 4, 2008

(54) MODELING ASYNCHRONOUS BEHAVIOR FROM PRIMARY INPUTS AND LATCHES

(75) Inventors: Zoltan T. Hidvegi, Round Rock, TX (US); Yee Ja, Round Rock, TX (US); Bradley S. Nelson, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 11/360,906

(22) Filed: Feb. 23, 2006

(65) Prior Publication Data

US 2007/0198238 A1    Aug. 23, 2007

(51) Int. Cl.
*G06F 17/50* (2006.01)
(52) U.S. Cl. .......................................... 703/15
(58) Field of Classification Search ........... 703/15, 703/13
See application file for complete search history.

(56) References Cited

U.S. PATENT DOCUMENTS

| | | | |
|---|---|---|---|
| 4,011,465 A | 3/1977 | Alvarez, Jr. |
| 5,287,289 A | 2/1994 | Kageyama et al. |
| 5,396,435 A | 3/1995 | Ginetti |
| 5,452,239 A | 9/1995 | Dai et al. |
| 5,499,192 A | 3/1996 | Knapp et al. |
| 5,504,690 A | 4/1996 | Kageyama et al. |
| 5,586,047 A | 12/1996 | Imahashi |
| 5,659,484 A | 8/1997 | Bennett et al. |
| 5,958,077 A | 9/1999 | Banerjee et al. |
| 5,966,523 A | 10/1999 | Uchino |
| 6,056,784 A | 5/2000 | Stanion |
| 6,071,003 A | 6/2000 | Ashuri et al. |
| 6,321,184 B1 | 11/2001 | Baumgartner et al. |
| 6,374,393 B1 | 4/2002 | Hirairi |
| 6,516,449 B2 | 2/2003 | Masud |
| 6,553,514 B1 | 4/2003 | Baumgartner et al. |
| 6,587,993 B2 | 7/2003 | Shoyama |
| 6,643,829 B1 | 11/2003 | Borkovic et al. |
| 6,643,832 B1 | 11/2003 | Ray et al. |
| 6,816,825 B1 | 11/2004 | Ashar et al. |
| 6,868,535 B1 | 3/2005 | Podkolzin et al. |
| 6,959,271 B1 | 10/2005 | Ballam |
| 6,973,632 B1 | 12/2005 | Brahme et al. |
| 7,020,589 B1 | 3/2006 | Datta Ray et al. |
| 7,086,016 B2 | 8/2006 | Matsuzaki et al. |

(Continued)

OTHER PUBLICATIONS

U.S. Appl. No. 11/360,906, filed Feb. 23, 2006, Hldvegi et al.

(Continued)

*Primary Examiner*—Zoila E. Cabrera
*Assistant Examiner*—Andre Pierre Louis
(74) *Attorney, Agent, or Firm*—Casimer K. Salys; Jack V. Musgrove

(57) ABSTRACT

Asynchronous behavior of a circuit is emulated by modifying a netlist to insert additional logic at a driving element such as a latch. The additional logic outputs one of (i) a present output from the driving element, (ii) a delayed output from the driving element, or (iii) a random value, which drives downstream logic. The output of the additional logic is selectively responsive to a user-controlled skew enable input. The invention allows for simpler data skew logic transformations which are applicable to both latches and primary inputs, with no dependencies on any clock net.

3 Claims, 4 Drawing Sheets

U.S. PATENT DOCUMENTS

| | | |
|---|---|---|
| 7,194,715 B2 | 3/2007 | Charlebois et al. |
| 7,240,311 B2 | 7/2007 | Lai et al. |
| 7,257,524 B2 * | 8/2007 | Schilp et al. .................. 703/14 |
| 2001/0020289 A1 | 9/2001 | Pavisic et al. |
| 2003/0023941 A1 * | 1/2003 | Wang et al. .................... 716/4 |
| 2004/0103387 A1 | 5/2004 | Teig et al. |
| 2004/0225977 A1 * | 11/2004 | Akkerman ..................... 716/6 |
| 2004/0233742 A1 | 11/2004 | Morzano |
| 2004/0250226 A1 | 12/2004 | Lin et al. |
| 2005/0246673 A1 | 11/2005 | Charlebois et al. |
| 2005/0273748 A1 | 12/2005 | Hetzel et al. |
| 2006/0095879 A1 | 5/2006 | Brahme et al. |
| 2006/0190860 A1 | 8/2006 | Ng et al. |
| 2006/0239392 A1 * | 10/2006 | Cummings et al. .......... 375/372 |
| 2007/0033551 A1 | 2/2007 | Greaves et al. |

OTHER PUBLICATIONS

U.S. Appl. No. 11/457,865, filed Jul. 17, 2006, Gass et al.

Xie et al., "Design of Robust-Path-Delay-Fault-Testable Combinational Circuits by Boolean Expansion", IEEE 1992 International Conference on Computer Design: VLSI in Computers and processors, Oct. 11-14, 1992, pp. 482-485.

Miyamoto et al., " An Efficient Algorithm for Deriving logic Functions of Asynchronous Circuits", Proceedings of Second International Symposium on Advanced research in Asynchronous Circuits and Systems, Mar. 18-21, 1996, pp. 30-35.

Gharaybeh et al., "False-Path Removal Using Delay Fault Simulation", Proceedings of Seventh Asian Test Symposium, Dec. 2-4, 1998, pp. 82-87.

* cited by examiner

MODELING ASYNCHRONOUS BEHAVIOR FROM PRIMARY INPUTS AND LATCHES

BACKGROUND OF THE INVENTION

1. Field of the Invention

The present invention generally relates to the fabrication and design of semiconductor chips and integrated circuits, and more particularly to a method of modeling the operation of a circuit running under asynchronous conditions.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Faster performance and predictability of responses are elements of interest in circuit designs. As process technology scales to the deep-submicron (DSM) regime, clock-related problems such as clock skew (jitter) and worst-case execution time are becoming increasingly important to the performance and reliability of IC chips and systems. Asynchronous circuits are often used in situations where such clock-related problems cannot be tolerated, but asynchronous circuit designs are difficult to test. Consequently, modeling of asynchronous circuits has become crucial to achieving an accurate system analysis, particularly the modeling of asynchronous connections between multiple synchronous clock domains (asynchronous boundaries).

With synchronous logic, static timing is performed to ensure that when a latch transitions, the correct value will meet the timing requirements of any downstream latch. One clock cycle is enough time for the transitioning value to be seen on the latch input without violating the setup requirements for that latch. Unfortunately, with asynchronous connections it is unrealistic to maintain static timing requirements because the receive latch may be clocked at any time after the send latch transitions. The transitioning data may not have had enough time to reach the input of the receive latch, and if the new value of the send latch fails to reach the receive latch prior to its sampling of the input, the prior value will be latched. If the transition occurs within the setup time required by the receive latch, the latch may become metastable. For a receive clock period, an old (pre-transition) value or new (post-transition) value may be latched, or the latch may be metastable for that clock period.

One technique for modeling asynchronous behavior is to substitute or insert additional logic in the behavioral description, netlist or representative circuit model. In one approach, a value for the input of the receive latch is toggled, or randomly chosen, whenever a transitioning value is to be latched. Another approach inserts delay elements in the asynchronous crossing and chooses a random delay for each crossing which is fixed for a duration of time. One limitation of the first approach is that a small window of time is created when synchronized transitioning data placed on an asynchronous bus will yield non-deterministic/unsynchronized bus values that are latched. The latter approach requires randomizer logic and delay logic as well as a multiplexer to choose the propagation delay to emulate, which can be quite expensive in terms of the amount of logic required for the modeling process. These requirements are especially costly if many asynchronous crossings exist in the model in which this logic will be inserted.

Another limitation of most transformations is that the netlist is transformed at the receive end of an asynchronous boundary. This method may exclude modeling some of the asynchronous behavior which occurs in crossings with combinational logic. An example is an asynchronous crossing between two latches with the source latch driving both inputs of an XOR gate, and the XOR gate output feeding the input to the receive latch. Asynchronous problems are producible with this logic configuration only if the model is transformed from the send side of the asynchronous crossing since the output from the XOR gate will otherwise never transition. Send-side skewing will only produce the output glitch when each input of the XOR is driven separately, i.e., each input of the XOR gate is driven by separate skew logic. However, the optimal skew logic for this example should ideally be able to produce all possible XOR output results. Transformations from the send side of asynchronous crossings have been devised but those transformations rely on the clock signal of the send latches to determine the starting time of skewing, which makes them inapplicable to some driving elements such as primary inputs. It would, therefore, be desirable to devise an improved method of circuit modeling which used simpler data skew logic transformations to emulate asynchronous behavior. It would be further advantageous if the method did not need to rely on clock signals in any model transformation, and were thus applicable to primary inputs as well as latches.

SUMMARY OF THE INVENTION

It is therefore one object of the present invention to provide an improved method of modeling asynchronous behavior of a circuit.

It is another object of the present invention to provide a method of modeling an propagation delay abstractly using random values.

It is yet another object of the present invention to provide a method for modeling asynchronous behavior of a circuit which is applicable to primary inputs as well as latches.

The foregoing objects are achieved in a method of modeling asynchronous behavior of a circuit, by identifying at least one driving element in a netlist for the circuit wherein the driving element has an output which is connected to downstream logic, and then modifying the netlist by inserting additional logic whose output is based on a combination of a present output from the driving element, a delayed output from the driving element, and a random value, to drive the downstream logic. The output of the additional logic may be selectively responsive to a user-controlled skew enable input. The delayed output is preferably delayed with respect to the present driving element output by a number of cycles n which is a minimum of a send clock period of the driving element and a receive clock period of the downstream logic. Exemplary embodiments use a variety of multiplexers, logic gates and randomizers to output a value which is either the random value, the present output from the driving element, or the delayed output.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention provides a novel method for modeling asynchronous behavior of a circuit, and is generally applicable to any type of digital circuit, such as execution units or memory, and clock-controlled (functional) or free-running (scan) logic. The method takes a netlist generated by conventional means and modifies that netlist by inserting additional logic to emulate asynchronous conditions and identify potential timing problems. As explained more fully below, the present invention utilizes simpler data skew logic transformations which are applicable to both latches and primary inputs.

Figure 1:
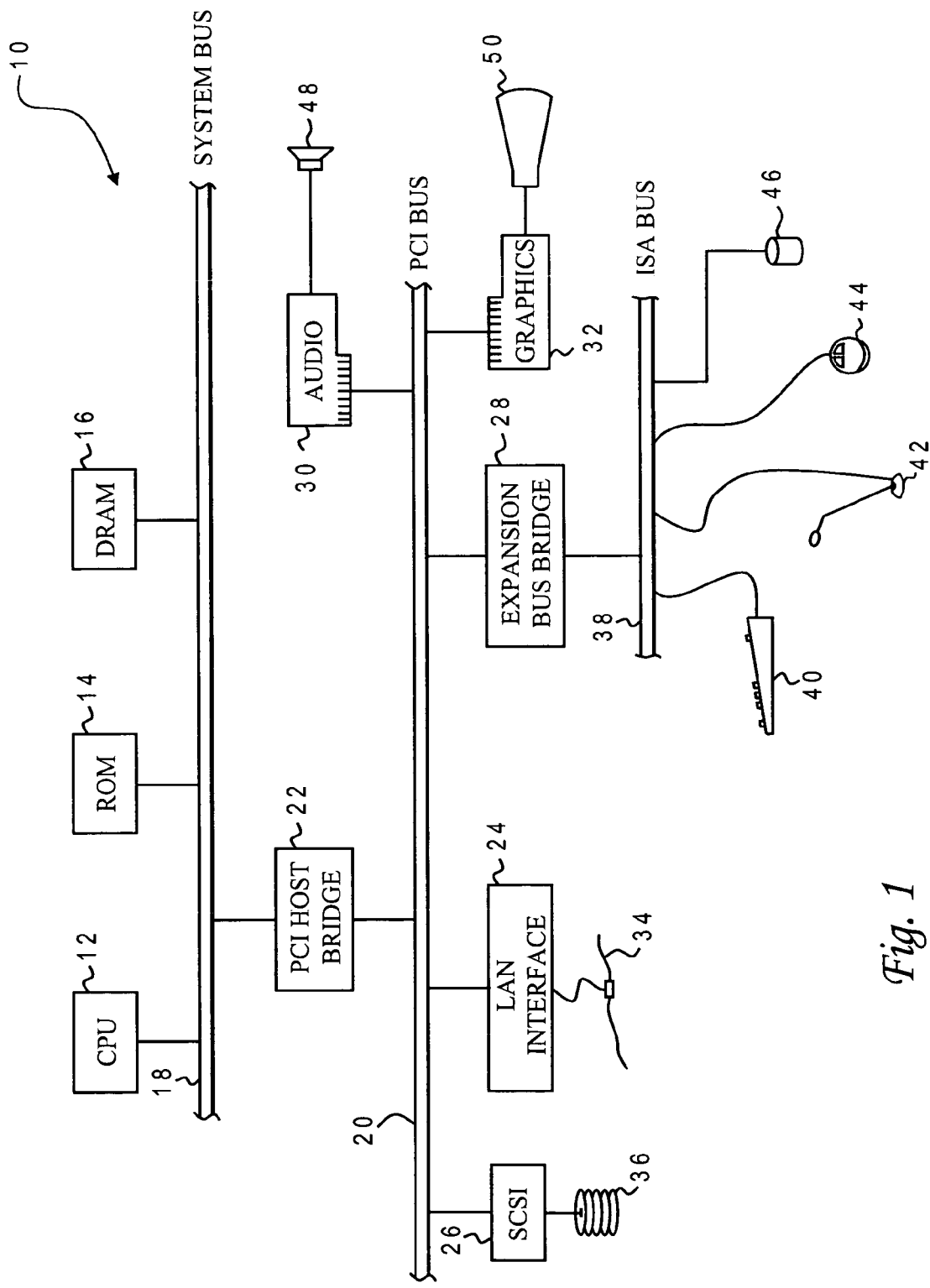
FIG. 1 is a block diagram of one embodiment of a computer system programmed to carry out modeling of asynchronous behavior of a circuit in accordance with the present invention.

With reference now to the figures, and in particular with reference to FIG. 1, there is depicted one embodiment 10 of a computer system programmed to carry out the model transformation in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the asynchronous modeling as taught herein.

While the illustrative implementation provides the program instructions embodying the present invention on disk drive 36, those skilled in the art will appreciate that the invention can be embodied in a program product utilizing other computer-readable media. The program instructions may be written in the C++ programming language for an AIX environment. System 10 may have additional programs that include conventional circuit design tools, e.g., to generate an original netlist, and to analyze the modified netlist that is created by the present invention.

Figure 2A:
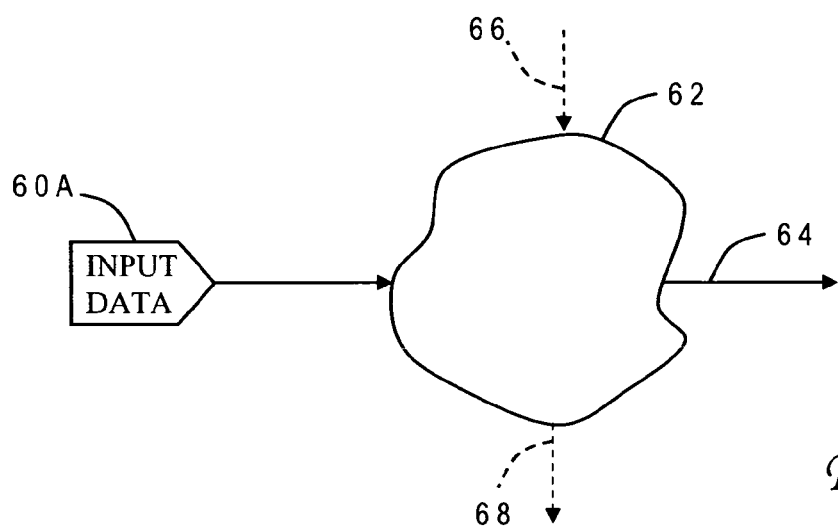
FIGS. 2A and 2B are simplified schematic diagrams of generalized asynchronous circuits which are to be modeled in accordance with the present invention, the circuits having a primary input (FIG. 2A) or a latch (FIG. 2B) which drives downstream logic.
Figure 2B:
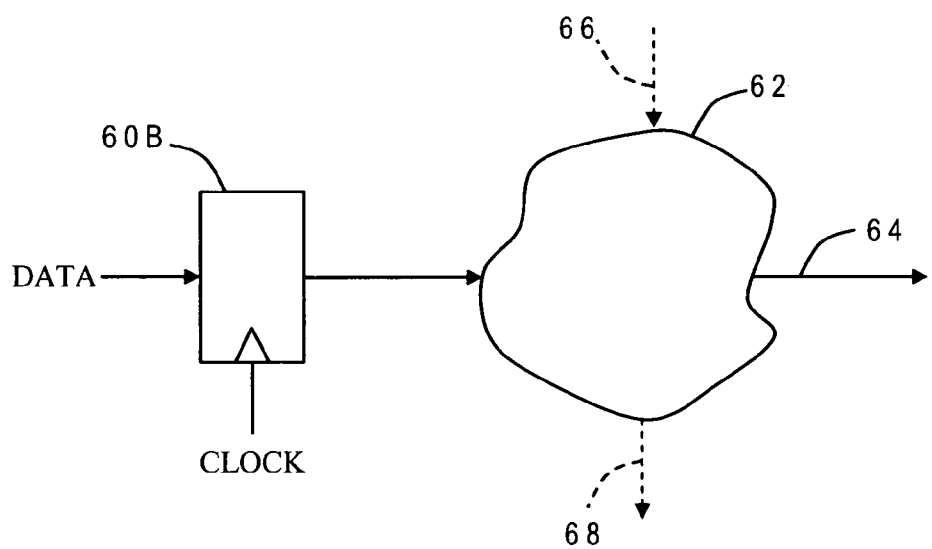

Computer system 10 carries out program instructions for a modeling process in which the targeted interfaces are asynchronous boundaries. FIGS. 2A and 2B illustrate simplified asynchronous circuits which may be modeled in accordance with the present invention. Each of these figures depicts a driving element 60a, 60b connected to an input of some generalized downstream logic 62. In FIG. 2A, driving element 60a is a direct input of the circuit; in FIG. 2B, driving element 60b is a latch. Downstream logic 62 has an output 64 which is connected to some other net in the circuitry. The downstream logic may have one or more additional inputs 66, and one or more additional outputs 68.

The method of the present invention begins with a netlist that includes an asynchronous circuit such as that shown in FIG. 2A or 2B, and modifies that netlist by inserting additional logic whose output is based on a combination of (i) the driving element output, (ii) a delayed output from the driving element, and (iii) a random value. The output of the new logic is then used to drive downstream logic 62 in the modified netlist. The original netlist may be generated using a conventional tool such as a VHDL or Verilog language compiler.

Figure 3:
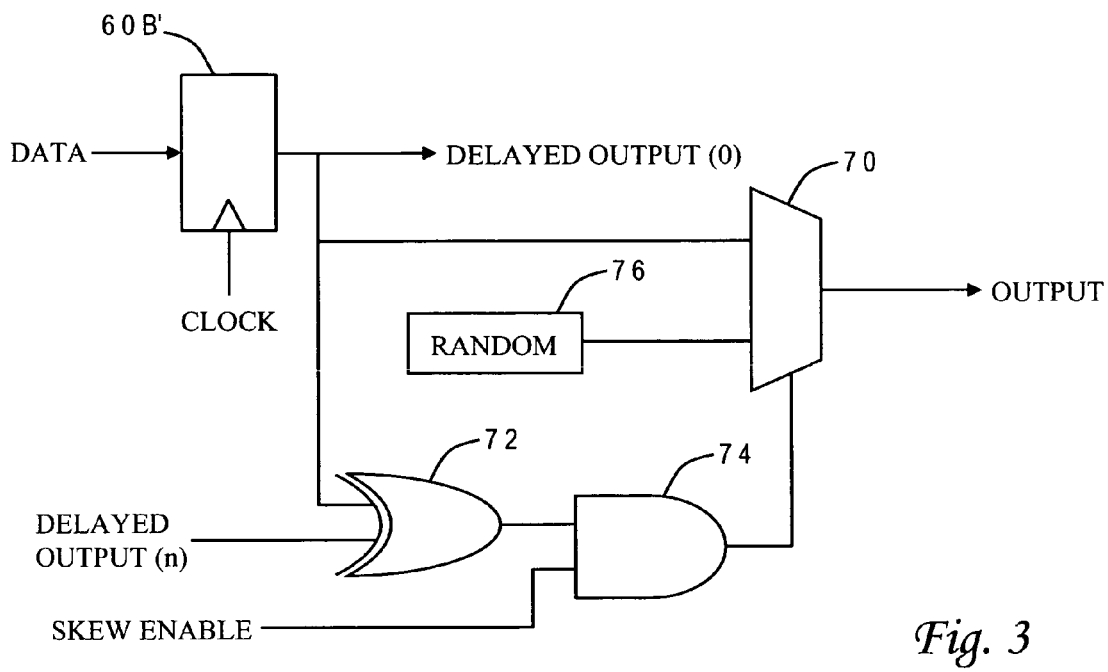
FIG. 3 is a schematic diagram of a model transformation for skew logic of an asynchronous circuit in accordance with one implementation of the present invention.
Figure 4:
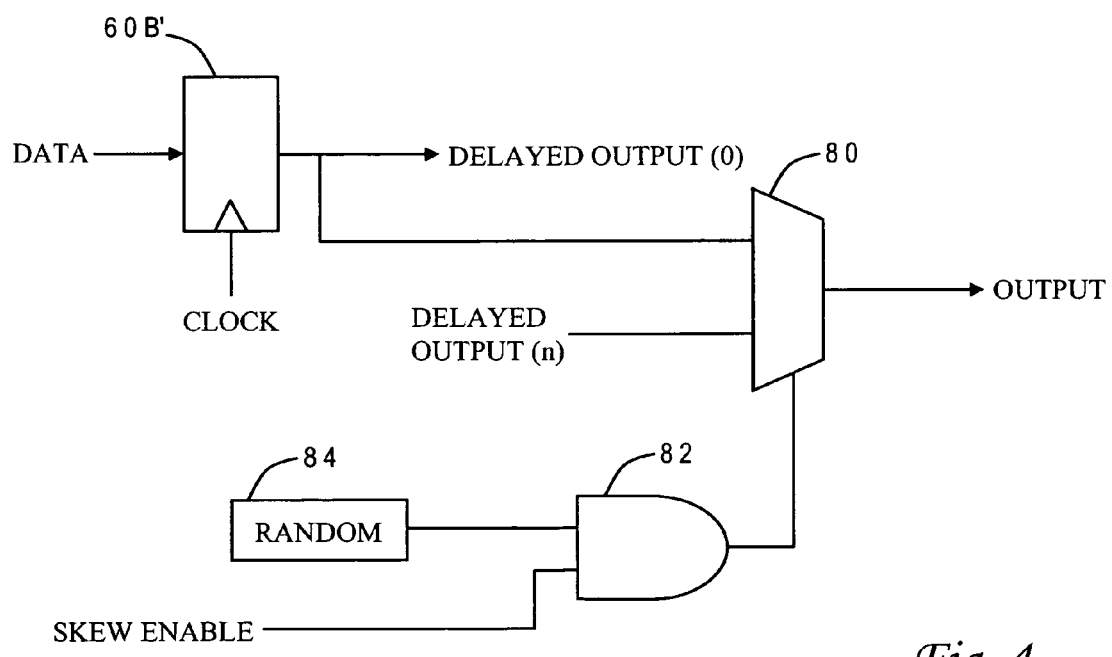
FIG. 4 is a schematic diagram of a simpler model transformation for skew logic of an asynchronous circuit in accordance with another implementation of the present invention.
Figure 5:
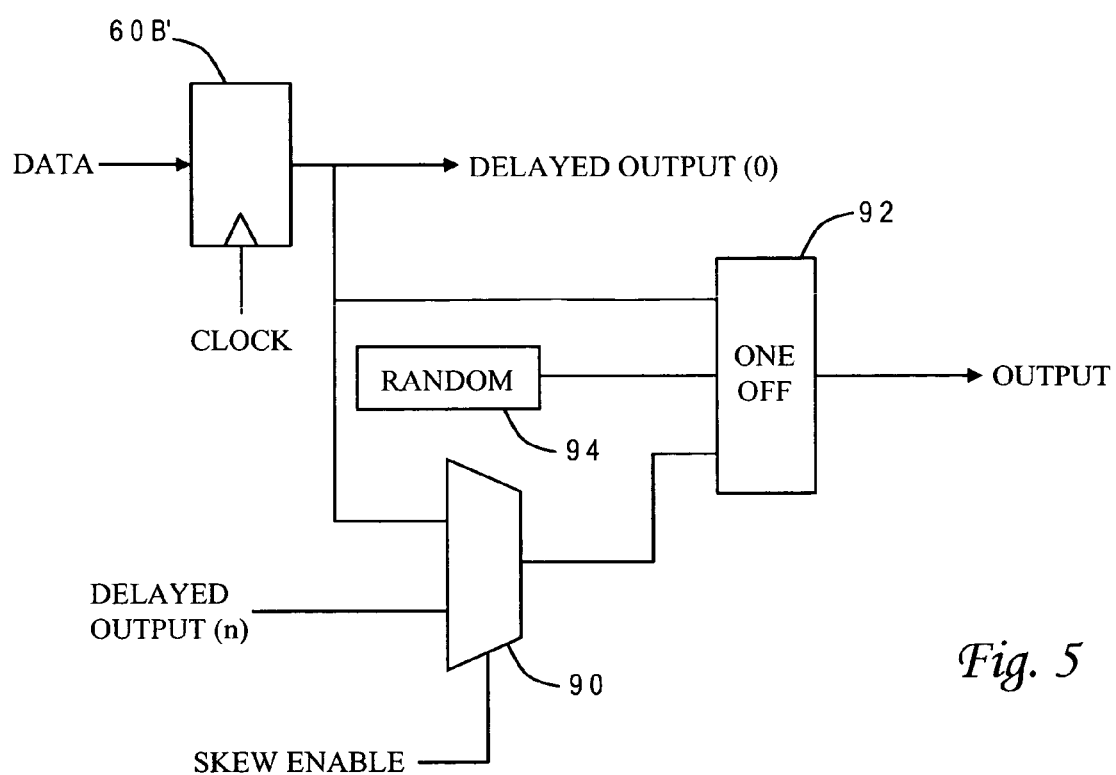
FIG. 5 is a schematic diagram of an even simpler model transformation for skew logic of an asynchronous circuit in accordance with yet another implementation of the present invention.

FIGS. 3-5 show three examples of model transformations according to the present invention. Although a latch is depicted as the driving element in each of those figures, the transforms can also be applied to a direct input by simply replacing the latch with the direct input pin. In each of the transforms of FIG. 3-5, the present output of latch 60b' is referred to as "delayed output(0)" while earlier states of the latch are denoted "delayed output(n)" where n is an integer representing the number of simulator (clock) cycles that have passed since that earlier state was latched. The delayed output (0) signal is utilized by the inserted logic, but may also be used for other simulations with any synchronous logic in the overall circuitry.

In FIG. 3 the delayed output(0) signal from latch 60b' is fed to a multiplexer 70 and to an XOR gate 72. The other input of XOR gate 72 is the delayed output(n) signal.

The value for n may be selected by the user, and is preferably the minimum of (i) the latch clock period and (ii) the downstream logic clock period. For example, if the send-side clock period is 5 simulator ticks, and the receive-side clock period is 10 simulator ticks, then n is 5. This value defines a minimum and maximum latency for the skewing of a single asynchronous crossing, i.e., 0 to n. For each usage of the asynchronous crossing, a different latency amount can be represented.

The output of XOR gate 72 is connected to an input of an AND gate 74 whose other input is a skew enable signal. The skew enable signal is controlled by the user of system 10 to enable or disable the data skew transformation. The output of AND gate 74 is connected to the select line of multiplexer 70. The other input to multiplexer 70 is a random value generator 76 which randomly outputs either a zero (logic low) or one (logic high). Multiplexer 70 will thus output an indeterminate value when the skew is active, i.e., when the output of AND gate 74 is on. A truth table for this transformation logic is given in Table 1.

TABLE 1

| Skew Enable | Delayed Output(0) | Delayed Output(n) | Output |
| --- | --- | --- | --- |
| 0 | — | — | Delayed Output(0) |
| 1 | 0 | 0 | Delayed Output(0) |

TABLE 1-continued

| Skew Enable | Delayed Output(0) | Delayed Output(n) | Output |
| --- | --- | --- | --- |
| 1 | 0 | 1 | random |
| 1 | 1 | 0 | random |
| 1 | 1 | 1 | Delayed Output(0) |

The new logic represents a propagation delay abstraction using quasi-random values in lieu of the true waveform without reference to the clock signals. This lack of dependence on the enable (clock) net makes the invention applicable to primary inputs and any internal nets, as well as latches. The randomizer logic could be replaced by an indeterminate value (e.g., an "X" value in a simulator that allows for multi-value representations).

A simpler skew transformation is illustrated in FIG. 4, wherein the delayed output(0) signal is again fed to a multiplexer 80, however the other input to multiplexer 80 is the delayed output(n) signal. The select line of multiplexer 80 is controlled by the output of an AND gate 82, whose inputs are a skew enable signal and a random value generator 84. When the skew signal is on, the output of the new logic will randomly fluctuate between the delayed output(0) signal and the delayed output(n) signal, i.e., it is effectively random.

An even simpler skew transformation is illustrated in FIG. 5, wherein the delayed output(0) signal is fed to a multiplexer 90 and to a ONE OFF gate 92. ONE OFF gate 92 is a lower level primitive used in some analysis tools in which the single output of the gate is one (logic high) only if there is no more than one input whose value is zero (logic low), and may otherwise be represented as a combination of AND and OR gates. The other inputs to ONE OFF gate 92 are from a random value generator 94 and the output of multiplexer 90. The other input to multiplexer 90 is the delayed output(n) signal. The select line of multiplexer 90 is controlled by the skew enable signal. A truth table for this transformation logic is given in Table 2.

TABLE 2

| Skew Enable | Delayed Output(0) | Delayed Output(n) | Output |
| --- | --- | --- | --- |
| 0 | — | — | Delayed Output(0) |
| 1 | 0 | 0 | 0 |
| 1 | 0 | 1 | random |
| 1 | 1 | 0 | random |
| 1 | 1 | 1 | 1 |

The present invention uses any of the foregoing transforms to created a modified netlist for a circuit. The modified netlist may then analyzed after the transformation using any conventional design tools such as a simulator or formal verification tool. This novel approach allows for simpler data skew logic transformations which are applicable to both latches and primary inputs, with no dependencies on the enable net. With the minimal logic and width/window of skewing combination provided by this invention, it becomes possible to insert this logic pervasively on large designs. The skewing window provided by the inserted logic is generally better than the small window of time provided by the original logic. The added logic is also an improvement over the fixed delays which are sometimes used in other solutions.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of modeling asynchronous behavior of a circuit stored as a netlist in a computer system, comprising:
    identifying at least one driving element in a netlist for the circuit wherein the driving element has an output which is connected to downstream logic; and
    modifying the stored netlist by inserting additional logic whose output is based on a combination of a present output from the driving element, a delayed output from the driving element, and a random value, to drive the downstream logic, wherein the delayed output from the driving element is delayed with respect to the present driving element output by a number of cycles n which is a minimum of a send clock period of the driving element and a receive clock period of the downstream logic, and wherein the additional logic includes
        a random value generator having an output,
        a multiplexer having at least two inputs, a first input of the multiplexer being connected to the present output from the driving element, and a second input of the multiplexer being connected to the output of the random value generator, the multiplexer further having an output which drives the downstream logic,
        an XOR gate having at least two inputs, a first input of the XOR gate being connected to the present output from the driving element, and a second input of the XOR gate being connected to the delayed output from the driving element, and
        an AND gate having at least two inputs, a first input of the AND gate being connected to an output of the XOR gate, and a second input of the AND gate being connected to a user-controlled skew enable signal, the AND gate further having an output which controls a select line of the multiplexer.

2. A computer system comprising:
    one or more processors which process program instructions;
    a memory device connected to said one or more processors; and
    program instructions residing in said memory device for modeling asynchronous behavior of a circuit by identifying at least one driving element in a netlist for the circuit wherein the driving element has an output which is connected to downstream logic, and modifying the netlist to insert additional logic whose output is based on a combination of a present output from the driving element, a delayed output from the driving element, and a random value, to drive the downstream logic, wherein the delayed output from the driving element is delayed with respect to the present driving element output by a number of cycles n which is a minimum of a send clock period of the driving element and a receive clock period of the downstream logic, and wherein the additional logic includes
        a random value generator having an output,
        a multiplexer having at least two inputs, a first input of the multiplexer being connected to the present output from the driving element, and a second input of the multiplexer being connected to the output of the random value generator, the multiplexer further having an output which drives the downstream logic,
        an XOR gate having at least two inputs, a first input of the XOR gate being connected to the present output from the driving element, and a second input of the XOR gate being connected to the delayed output from the driving element, and
        an AND gate having at least two inputs, a first input of the AND gate being connected to an output of the XOR gate, and a second input of the AND gate being connected to a user-controlled skew enable signal, the AND gate further having an output which controls a select line of the multiplexer.

3. A computer program product comprising:
a computer-readable medium; and
program instructions residing in said medium for modeling asynchronous behavior of a circuit stored as a netlist in a computer system by identifying at least one driving element in a netlist for the circuit wherein the driving element has an output which is connected to downstream logic, and modifying the stored netlist to insert additional logic whose output is based on a combination of a present output from the driving element, a delayed output from the driving element, and a random value, to drive the downstream logic, wherein the delayed output from the driving element is delayed with respect to the present driving element output by a number of cycles n which is a minimum of a send clock period of the driving element and a receive clock period of the downstream logic, and wherein the additional logic includes
    a random value generator having an output,
    a multiplexer having at least two inputs, a first input of the multiplexer being connected to the present output from the driving element, and a second input of the multiplexer being connected to the output of the random value generator, the multiplexer further having an output which drives the downstream logic,
    an XOR gate having at least two inputs, a first input of the XOR gate being connected to the present output from the driving element, and a second input of the XOR gate being connected to the delayed output from the driving element, and
    an AND gate having at least two inputs, a first input of the AND gate being connected to an output of the XOR gate, and a second input of the AND gate being connected to a user-controlled skew enable signal, the AND gate further having an output which controls a select line of the multiplexer.

* * * * *